United States Patent
Yang et al.

(10) Patent No.: US 11,488,830 B2
(45) Date of Patent: Nov. 1, 2022

(54) OXYGEN FREE DEPOSITION OF PLATINUM GROUP METAL FILMS

(71) Applicant: Applied Materials, Inc., Santa Clara, CA (US)

(72) Inventors: Yixiong Yang, Fremont, CA (US); Wei V. Tang, Santa Clara, CA (US); Seshadri Ganguli, Sunnyvale, CA (US); Sang Ho Yu, Cupertino, CA (US); Feng Q. Liu, San Jose, CA (US); Jeffrey W. Anthis, San Jose, CA (US); David Thompson, San Jose, CA (US); Jacqueline S. Wrench, San Jose, CA (US); Naomi Yoshida, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 502 days.

(21) Appl. No.: 16/549,756

(22) Filed: Aug. 23, 2019

(65) Prior Publication Data
US 2020/0063263 A1 Feb. 27, 2020

Related U.S. Application Data

(60) Provisional application No. 62/721,917, filed on Aug. 23, 2018.

(51) Int. Cl.
*H01L 21/285* (2006.01)
*C23C 16/455* (2006.01)
*C23C 16/18* (2006.01)
*H01L 23/532* (2006.01)
*C23C 16/04* (2006.01)

(52) U.S. Cl.
CPC ........ *H01L 21/28562* (2013.01); *C23C 16/04* (2013.01); *C23C 16/18* (2013.01); *C23C 16/45553* (2013.01); *H01L 21/28518* (2013.01); *H01L 21/28568* (2013.01); *H01L 23/53242* (2013.01)

(58) Field of Classification Search
None
See application file for complete search history.

(56) References Cited

U.S. PATENT DOCUMENTS

| | | | |
|---|---|---|---|
| 3,622,367 A | 11/1971 | Haag et al. | |
| 5,130,172 A * | 7/1992 | Hicks | C07F 1/08 427/124 |
| 5,320,978 A | 6/1994 | Hsu | |
| 5,736,422 A | 4/1998 | Lee et al. | |
| 6,750,110 B1 | 6/2004 | Derderian | |
| 2006/0147626 A1* | 7/2006 | Blomberg | C23C 16/45527 427/248.1 |
| 2018/0066357 A1* | 3/2018 | Harada | C07C 211/21 |

\* cited by examiner

*Primary Examiner* — Katie L. Hammer
(74) *Attorney, Agent, or Firm* — Servilla Whitney LLC

(57) ABSTRACT

Methods of depositing platinum group metal films of high purity, low resistivity, and good conformality are described. A platinum group metal film is formed in the absence of an oxidant. The platinum group metal film is selectively deposited on a conductive substrate at a temperature less than 200° C. by using an organic platinum group metal precursor.

14 Claims, 4 Drawing Sheets

OXYGEN FREE DEPOSITION OF PLATINUM GROUP METAL FILMS

CROSS-REFERENCE TO RELATED APPLICATIONS

This application claims priority to U.S. Provisional Application No. 62/721,917, filed Aug. 23, 2018, the entire disclosure of which is hereby incorporated by reference herein.

TECHNICAL FIELD

Embodiments of the present disclosure pertain generally to film deposition. More particularly, embodiments of the disclosure provide methods for depositing platinum group metal films in the absence of an oxidant.

BACKGROUND

The semiconductor processing industry continues to strive for larger production yields while increasing the uniformity of layers deposited on substrates having larger surface areas. These same factors, in combination with new materials, also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Atomic layer deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Because of their high corrosion resistance, microelectronic devices having platinum group metals are desired in applications where great reliability is desired and also where a corrosive atmosphere may be present. Existing platinum group metal deposition requires an oxidation reactant. The oxidation reactant diffuses through the deposited platinum group metal film, oxidizing the substrate and causing resistivity increases and adhesion deterioration. As a result, the device performance can be seriously compromised. Thus, there is a need for methods of depositing platinum group metal films which do not result in damage to the underlying substrate.

SUMMARY

Apparatuses and methods to manufacture integrated circuits are described. In one or more embodiments, a method of depositing a film is described. In an embodiment, the method comprises flowing an organic platinum group metal precursor into a deposition chamber in the presence of a reducing agent. The deposition chamber is substantially free of an oxidant. A platinum group metal film is then selectively deposited on a conductive substrate at a temperature less than 200° C.

In one or more embodiments, a method of depositing a film is described. The method comprises positioning a conductive substrate in a processing chamber. The conductive substrate is then exposed to an organic platinum group metal precursor to selectively deposit a platinum group metal film on the conductive substrate at a temperature less than 200° C. The processing chamber is purged of the organic platinum group metal precursor. The conductive substrate is then exposed to a reducing agent, the processing chamber substantially free of an oxidant. The processing chamber is then purged of the reducing agent.

In one or more embodiments, an electronic device is described. The electronic device comprises a conductive substrate. At least one feature is formed in the conductive substrate. A platinum group metal film is on the conductive substrate and is on the at least one feature. The platinum group metal film has an impurity of less than 5 atomic % and a resistivity less than 100 μΩ-cm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
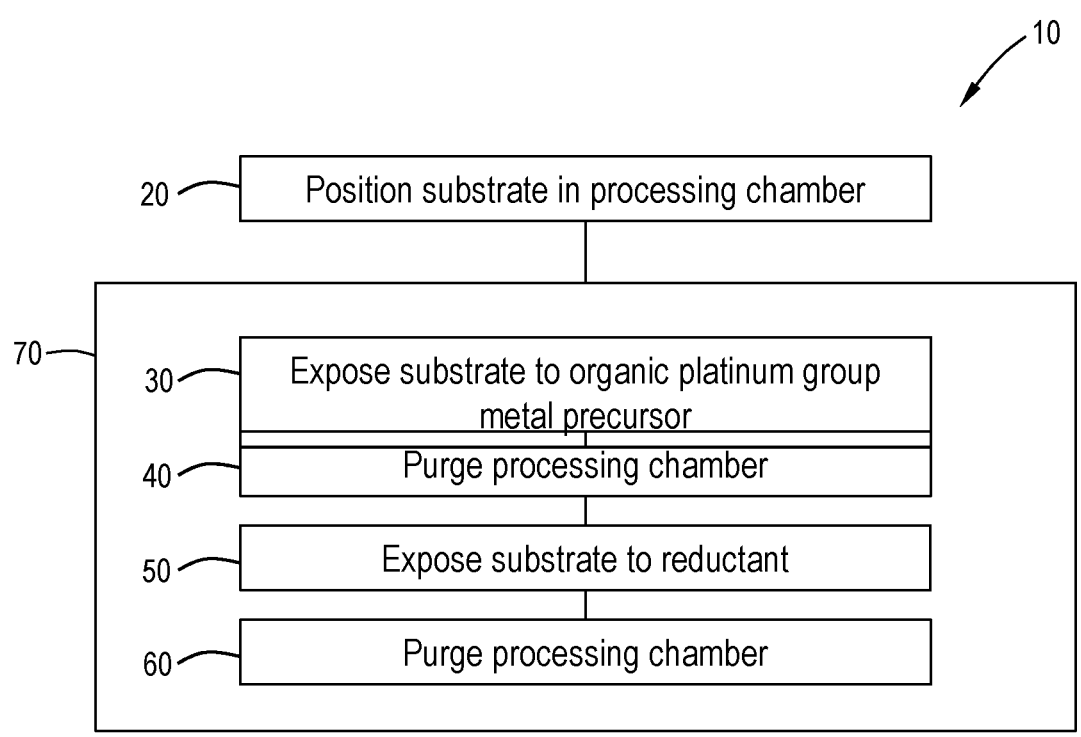
FIG. 1 depicts a flow process diagram of one embodiment of a method of forming a thin film according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

Embodiments of the disclosure provide processes for depositing platinum group metal films. The process of various embodiments uses vapor deposition techniques, such as an atomic layer deposition (ALD) or chemical vapor deposition (CVD) to provide platinum group metal films. One or more embodiments advantageously provide a method of depositing a platinum group metal film on a conductive substrate, which deposition is conducted in the absence of an oxidant. The lack of an oxidant advantageously results in a platinum group metal film having a low impurity level (e.g. less than 5 atomic % atomic), low resistivity (e.g. less than 100 µΩ-cm, including less than 90 µΩ-cm, less than 80 µΩ-cm, less than 70 µΩ-cm, less than 60 µΩ-cm, less than 50 µΩ-cm, less than 40 µΩ-cm, less than 30 µΩ-cm, less than 20 µΩ-cm, or less than 10 µΩ-cm), high work function, good surface roughness when compared to the roughness of the conductive substrate prior to deposition, and good conformality.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

A "conductive substrate" as used herein, refers to a substrate that conducts electricity. Conductive substrates include conductor and semiconductor materials.

A "non-conductive substrate" as used herein, refers to a substrate that acts as an insulator.

In one or more embodiments, the substrate is a conductive substrate. In some embodiments the conductive substrate is selected from a metal, a metal carbide, a metal nitride, or a metal silicide. The conductive substrate may comprise a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W). In one or more specific embodiments, the metal substrate can comprise titanium nitride (TiN) or tantalum nitride (TaN).

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. organic platinum group metal precursor) is pulsed into the reaction zone followed by a first time delay. Next, a second precursor or compound B (e.g. reductant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The platinum group metal-containing process gas may be provided in one or more pulses or continuously. The flow rate of the platinum group metal-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The organic platinum group metal precursor of formula I can be provided at any suitable pressure including, but not limited to, a pressure in the range of about 5 mTorr to about 500 Torr, or in the range of about 100 mTorr to about 500 Torr, or in the range of about 5 Torr to about 500 Torr, or in the range of about 50 mTorr to about 500 Torr, or in the range of about 100 mTorr to about 500 Torr, or in the range of about 200 mTorr to about 500 Torr.

The period of time that the conductive substrate is exposed to the platinum group metal-containing process gas may be any suitable amount of time necessary to allow the organic platinum group metal precursor to form an adequate nucleation layer atop the conductive substrate surfaces. For example, the process gas may be flowed into the process chamber for a period of about 0.1 seconds to about 90 seconds. In some time-domain ALD processes, the platinum group metal-containing process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert carrier gas may additionally be provided to the process chamber at the same time as the platinum group metal-containing process gas. The carrier gas may be mixed with the platinum group metal-containing process gas (e.g., as a diluent gas) or separately and can be pulsed or of a constant flow. In some embodiments, the carrier gas is flowed into the processing chamber at a constant flow in the range of about 1 to about 10000 sccm. The carrier gas may be any inert gas, for example, such as argon, helium, neon, combinations thereof, or the like. In one or more specific embodiments, the platinum group metal-containing process gas is mixed with argon prior to flowing into the process chamber.

The temperature of the conductive substrate during deposition can be controlled, for example, by setting the temperature of the substrate support or susceptor. In some embodiments the conductive substrate is held at a temperature less than about 200° C., including a temperature less than about 190° C., less than about 180° C., less than about 170° C., less than about 160° C., less than about 150° C., less than about 140° C., less than about 130° C., less than about 120° C., less than about 110° C., or less than about 100° C. In one or more embodiments, the substrate is maintained at a temperature in the range of about 100° C. to about 130° C.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As will be understood by the skilled artisan, "chemical vapor deposition" refers to a process in which a substrate surface is exposed to precursors and/or co-reagents simultaneously or substantially simultaneously. As used herein, "substantially simultaneously" refers to either co-flow or where there is overlap of exposures of the precursors so that the reactive species are able to react in the gas phase.

In one or more embodiments, the platinum group metals which can be deposited onto the surface of a conductive substrate include platinum (Pt), palladium (Pd), iridium (Ir), osmium (Os), ruthenium (Ru), and rhodium (Rh), or mixtures thereof. In one or more embodiments, the platinum group metal film is one or more of a platinum group metal metallic film, a platinum group metal carbide film, a platinum group metal nitride film, or a platinum group metal silicide film. For example, the platinum group metal film may be a platinum carbide film, or a platinum nitride film, or a platinum silicide film. In other embodiment, the platinum group metal is a platinum group metal metallic film, and the platinum group metal consists essentially of platinum. As used herein, the term "consists essentially of" means that the composition of the bulk film comprises the elements specified in a sum totaling 95%, 98%, 99% or 99.5% of the total elemental composition on an atomic basis.

The platinum group metal film may be deposited by pulsing or coflowing an organic platinum group metal precursor containing the desired platinum group metal and a reducing agent (i.e. reactant) into a flow gas or carrier gas. As used herein, the term "carrier gas" refers to a fluid (either gas or liquid) that can move a precursor molecule from one location to another. For example, a carrier gas can be a liquid that moves molecules from a solid precursor in an ampoule to an aerosolizer. In some embodiments, a carrier gas is an inert gas. In one or more embodiments, a carrier gas is one or more of argon (Ar), helium (He), xenon (Xe), or nitrogen ($N_2$).

The organic platinum group metal precursor may be any suitable organic compound which will allow the platinum group metal to deposit onto a conductive substrate under CVD or ALD conditions.

In one or more embodiments, the organic platinum group metal precursor has a structure of general formula I:

wherein $R^1$ and $R^2$ are independently selected from $C_{1-4}$ alkyl, hydrogen, halogen, CO, and cyclopentadienyl; M is a platinum group metal; and L is a ligand comprising at least one carbon-carbon double bond, a $(CH_2)_x$ where x is 1 to 8, and a $NR^3R^4$ where $R^3$ and $R^4$ are independently selected from $C_{1-4}$ alkyl, hydrogen, or halogen.

In one or more embodiments, the platinum group metal, M, is selected from one or more of platinum (Pt), palladium (Pd), iridium (Ir), osmium (Os), ruthenium (Ru), or rhodium (Rh). As recognized by one skilled in the art, the platinum group metal, M, may be a mixture of platinum group metals. For example, M may be a mixture of platinum (Pt) and palladium (Pd).

In one or more embodiments, L is a ligand. As used herein, the term "ligand" refers to an ion or molecule that binds to a metal atom for form a coordination complex. The bonding with the metal generally involves donation of one or more of the ligand's electron pairs. L is a ligand comprising at least one carbon-carbon double bond, a $(CH_2)_x$ where x is 1 to 8, and a $NR^3R^4$ where $R^3$ and $R^4$ are independently selected from $C_{1-4}$ alkyl, hydrogen, or halogen. A carbon-carbon double bond is a chemical bond between two carbon atoms involving four bonding electrons. As used herein, the term alkylene group refers to the group $(CH_2)_x$ where x may be from 1 to 8, including 1, 2, 3, 4, 5, 6, 7, or 8. As used herein, the term amine refers to the group $NR^3R^4$, where the nitrogen atom is also bound to another group (e.g. $(CH_2)_x$, alkylene group) in the ligand, L.

As used herein, "halogen" refers to one or more of a group of elements in the periodic table, more particularly fluorine (F), chlorine (Cl), bromine (Br), iodine (I), and astatine (At).

As used herein, "alkyl," or "alk" includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. In one or more embodiments, each of $R^1$ and $R^2$ are independently selected from $C_{1-4}$ alkyl, hydrogen, halogen, CO, and cyclopentadienyl. In one or more embodiments, each of $R^3$ and $R^4$ are independently selected from $C_{1-4}$ alkyl, hydrogen, or halogen.

In one or more specific embodiments, the organic platinum group metal precursor has a structure of general formula I:

wherein $R^1$ and $R^2$ are independently selected from $C_{1-4}$ alkyl, hydrogen, CO, and cyclopentadienyl; M is a platinum group metal; and L is a ligand $R^5NR^3R^4$ where $R^3$ and $R^4$ are independently selected from $C_{1-4}$ alkyl or hydrogen, $R^5$ is an alkenyl group comprising $C_nH_{2n-1}$ or an alkynyl group comprising $C_nH_{2n-3}$ where n is from 3 to 8.

As used herein, "alkenyl," includes both straight and branched chain hydrocarbons of 2 to 20 carbons, preferably 2 to 12 carbons, and more preferably 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein. In one or more embodiments the alkenyl group has from 3 to 8 carbon atoms.

In a specific embodiment, the carbon-carbon double bond is coordinated to the platinum group metal, M. In a specific embodiment, the amine is directly bonded to the platinum group metal, M.

In one or more embodiments, the organic platinum group metal precursor is pulsed or coflowed with a reducing agent (i.e. reactant) into a processing chamber. The reducing agent may be any reducing agent known to those of skill in the art of ALD and CVD film deposition. In one or more embodiments, the reducing agent includes, but is not limited to, one or more of hydrogen ($H_2$), ammonia ($NH_3$), hydrazine ($N_2H_4$), silane ($SiH_4$), or disilane ($Si_2H_6$).

The organic platinum group metal precursor is pulsed or coflowed with a reducing reactant into a processing chamber in the absence of an oxidant. The oxidant may be any oxidizing agent known to those of skill in the art of ALD and CVD film deposition. In one or more embodiments, the oxidant includes, but is not limited to, one or more of molecular oxygen ($O_2$), ozone ($O_3$), direct $O_2$ plasma, remote $O_2$ plasma, water ($H_2O$), or nitrogen oxides (e.g. NO, $NO_2$, $N_2O$, $N_4O$, $N_2O_3$, $N_2O_4$, $N_2O_5$, $N_4O_6$, and the like). Thus, in some embodiments, the processing chamber is devoid of water, oxygen, ozone, direct and remote $O_2$ plasma, nitrogen oxides, and the like. In other words, the processing chamber is not an oxidizing environment.

Without intending to be bound by theory, it is thought that an oxidant will diffuse through the deposited platinum group metal film to oxidize the underlying substrate, causing resistivity increases and adhesion deterioration. As a result, the device performance, such as M cell or a non-volatile ferroelectric cell, can be seriously deteriorated. Accordingly, one or more embodiments provide a method of depositing a platinum group metal film (e.g. platinum, platinum nitride, platinum silicide, and the like) without using any oxidants.

The method of one or more embodiments provides for selective deposition of a platinum group metal (e.g. platinum, platinum nitride, platinum silicide, platinum carbide, and the like) on a conductive substrate. The deposition of the platinum group metal is selective against deposition on a nonconductive substrate (e.g. $SiO_2$, silicon oxycarbide, silicon nitride, silicon carbonitride, titanium oxynitride, and the like). In one or more embodiments, deposition using the organic platinum group metal precursor in combination with a reducing agent (i.e. reductant), and in the absence of an oxidant, provides a more selective platinum group metal film than a deposition using an oxidant (e.g. oxygen, water, etc.). As used herein, the term "selective" means that deposition of the platinum group metal film on the conductive substrate occurs instead of deposition on a nonconductive substrate in a ratio greater than or equal to about 5:1, 10:1, 15:1, 20:1, 25:1, 30:1, 35:1, 40:1, 45:1, 50:1. 100:1, 200:1, 300:1, 400:1, 500:1, 1000:1, or more.

Without intending to be bound by theory, it is thought that there is a synergistic relationship between the organic platinum group metal precursor, reducing agent (i.e. reactant), and conductive substrate that results in the observed selectivity. This synergistic relationship exists when the reaction is performed in the absence of an oxidant.

FIG. 1 depicts a flow diagram of a method 10 of depositing a film in accordance with one or more embodiments of the present disclosure. With reference to FIG. 1, the method 10 comprises a deposition cycle 70. The method 10 begins at operation 20 by positioning a conductive substrate into a processing chamber.

The conductive substrate may be any conductive substrate known to one of skill in the art. In one or more embodiments, the conductive substrate comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W).

At operation 30, the conductive substrate is exposed in the processing chamber to the organic platinum group metal precursor to deposit a platinum group metal-containing film.

At operation 40, the processing chamber is purged of the organic platinum group metal precursor. Purging can be accomplished with any suitable gas that is not reactive with the substrate, film on the substrate, and/or processing chamber walls. Suitable purge gases include, but are not limited to, $N_2$, He, and Ar. The purge gas may be used to purge the processing chamber of the organometallic precursor, and/or the oxidant. In some embodiments, the same purge gas is used for each purging operation. In other embodiments, a different purge gas is used for the various purging operations.

At operation 50, the conductive substrate is exposed to a reducing agent to react with the metal-containing film to form a platinum group metal film. In one or more embodiments, the reducing agent is selected from one or more of hydrogen ($H_2$), ammonia ($NH_3$), hydrazine ($N_2H_4$), silane ($SiH_4$), or disilane ($Si_2H_6$). In one or more embodiments, the processing chamber is substantially free of an oxidant. As used herein, the term "substantially free" means that the processing chamber has less than 5.0 wt. % oxidant, including less than 4.0 wt. % oxidant, less than 3.0 wt. % oxidant, less than 2.0 wt. % oxidant, less than 1.0% wt. % oxidant, and less than 0.5 wt. % oxidant.

In addition to the selectivity improvement, in one or more embodiments, using the organic platinum group metal precursor in combination with a reducing agent in the absence of an oxidant, also advantageously offers unique film properties for the platinum group metal films. For example, the films prepared according to the methods of one or more embodiments, may have a roughness in a range of about 0.1 nm to about 3.0 nm. In one or more embodiments, the films prepared have a rough that is substantially the same as the roughness of the conductive substrate prior to deposition of the film. As used herein, the term "substantially the same" means that the roughness of the deposited film is less than about 5% of the roughness of the conductive substrate prior to deposition of the film, including less than about 4%, less than about 3%, less than about 2%, or less than about 1%. The roughness of the platinum group metal films is measured by atomic force microscopy (AFM). The films prepared according to one or more embodiments have a low resistivity. More specifically, the resistivity of the platinum group metal films is less 100 μΩ-cm. The platinum group metal film of one or more embodiments has an impurity of less than 5 atomic %. The platinum group metal films of one or more embodiments are high work function materials and selective low resistivity etch stop layers. In one or more embodiments, the platinum group metal film is selectively deposited on a conductive substrate to protect/stop the etching process before reaching the underlying metal of the conductive substrate.

Figure 2:
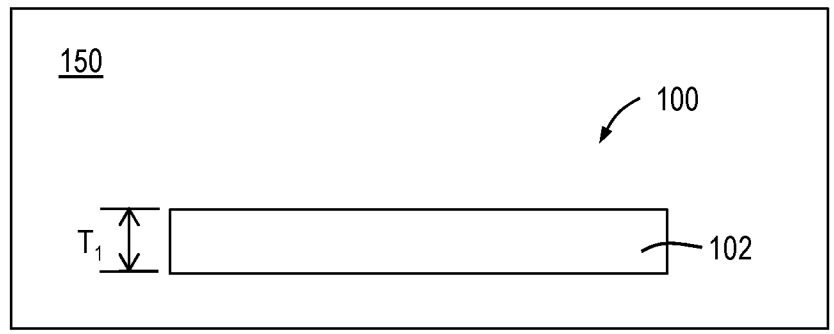
FIG. 2 illustrates a cross-sectional view of a substrate according to one or more embodiments.
Figure 3:
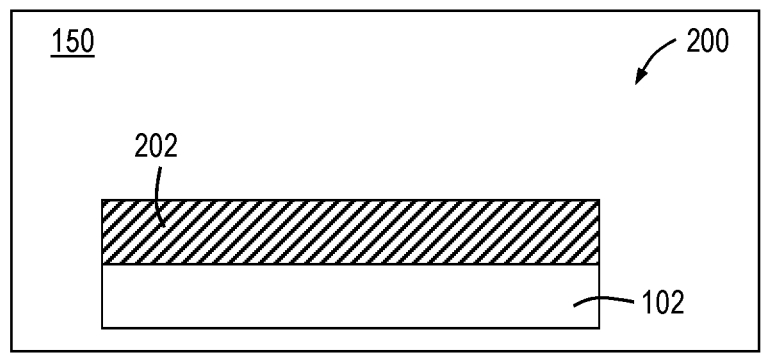
FIG. 3 illustrates a cross-sectional view of a substrate according to one or more embodiments.

FIGS. 2-3 provide cross-sectional views according to one or more embodiments. In one or more embodiments, the conductive substrate 102 may be patterned according to any of the techniques known to those of skill in the art. FIG. 2 is a cross-sectional view 100 of a conductive substrate 102 according to one or more embodiments. In one or more embodiments, a conductive substrate 102 is provided and placed in a processing chamber 150. As used in this specification and the appended claims, the term "provided" means that the substrate is made available for processing (e.g., positioned in a processing chamber). The conductive substrate 102 has a thickness $T_1$. In one or more embodiments, the conductive substrate 102 has a thickness $T_1$ of about 1 nm to about 50 nm.

In one or more embodiments, the conductive substrate 102 comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W). In one or more embodiments, the conductive substrate is one or more of a metal, a metal carbide, a metal nitride, or a metal silicide. In one or more specific embodiments, the conductive substrate 102 comprises or consists essentially of titanium nitride.

FIG. 3 is a cross-sectional view 200 of a conductive substrate 102 according to one or more embodiments. According to the method of one or more embodiments, the conductive substrate 102 positioned in processing chamber 150 is exposed to an organic platinum group metal precursor to deposit a platinum group metal film 202 on the conductive substrate 102.

In one or more embodiments, the organic platinum group metal precursor has a structure of general formula I:

wherein $R^1$ and $R^2$ are independently selected from $C_{1-4}$ alkyl, hydrogen, halogen, CO, and cyclopentadienyl; M is a platinum group metal; and L is a ligand comprising at least one carbon-carbon double bond, a $(CH_2)_x$ where x is 1 to 8, and a $NR^3R^4$ where $R^3$ and $R^4$ are independently selected from $C_{1-4}$ alkyl or hydrogen.

In one or more embodiments, the platinum group metal film 202 comprises a platinum group metal selected from the group consisting of platinum (Pt), palladium (Pd), iridium (Ir), osmium (Os), ruthenium (Ru), rhodium (Rh), and mixtures thereof. In one or more embodiments, the platinum group metal film is one or more of a platinum group metal metallic film, a platinum group metal carbide film, a platinum group metal nitride film, or a platinum group metal silicide film. In one or more specific embodiments, the platinum group metal consists essentially of platinum (Pt).

In one or more embodiments, exposing the conductive substrate 102 to an organic platinum group metal precursor to deposit a platinum group metal film 202 involves an atomic layer deposition (ALD), which employs sequential, self-limiting surface reactions to form the platinum group metal film 202. In one or more embodiments, an organic platinum group metal precursor is introduced into a processing chamber, where it partially reacts with the surface of the conductive substrate 102. Then, a reductant is introduced to reduce the partially reacted precursor to a platinum group metal film 202. In one or more embodiments, the processing chamber is free of an oxidant. As used herein, the term "free of an oxidant" or "in the absence of an oxidant" means that there is less than about 5 wt. % oxidant present, including less than about 4.5 wt. %, less than about 4.0 wt. %, less than about 3.5 wt. %, less than about 3.0 wt. %, less than about 2.5 wt. %, less than about 2.0 wt. %, less than about 1.5 wt. %, less than about 1.0 wt. %, less than about 0.5 wt. %, less than about 0.25 wt. %, and less than about 0.1 wt. %.

In one or more embodiments, exposing the conductive substrate 102 to an organic platinum group metal precursor to deposit a platinum group metal film 202 utlizes chemical vapor deposition (CVD), which involves co-flowing an organic platinum group metal precursor and a reducing agent, in the absence of an oxidant, to form the platinum group metal film 202.

Reaction conditions, including temperature, pressure, processing time, the substrate surface(s), and the organic platinum group metal precursors can be selected to obtain the desired level of selective deposition of the platinum group metal film 202 on the conductive substrate 102.

In one or more embodiments, the conductive substrate 102 is exposed to the organic platinum group metal precursor at a temperature less than about 200° C. including a temperature less than about 190° C., less than about 180° C., less than about 170° C., less than about 160° C., less than about 150° C., less than about 140° C., less than about 130° C., less than about 120° C., less than about 110° C., or less than about 100° C. In one or more embodiments, the substrate is maintained at a temperature in the range of about 100° C. to about 130° C.

In one or more embodiments, the conductive substrate 102 is exposed to the organic platinum group metal precursor for a period of time in the range of about 1 minute to about 30 minutes, including about 1 minute, about 5 minutes, about 10 minutes, about 15 minutes, about 20 minutes, about 25 minutes, and about 30 minutes.

One or more embodiments are directed to a method of depositing a film. In one or more embodiments, the method comprises providing a conductive substrate 102. The conductive substrate 102 is exposed to an organic platinum group metal precursor in a processing chamber 150 to deposit a first metal film (not shown) on the metal layer 106. The processing chamber 150 is purged of the organic platinum group metal precursor. The conductive substrate 102 is exposed to a reducing reactant gas (reductant) in the absence of an oxidant to react to form a platinum group metal film 202 on the conductive substrate 102. The processing chamber 150 is then purged of reductant.

In one or more embodiments, purging the processing chamber comprises flowing a purge gas over the conductive substrate. The purge gas may be selected from one or more of argon (Ar), nitrogen ($N_2$), or helium (He).

The method of one or more embodiments may be repeated more than once to provide a platinum group metal film on a conductive substrate.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Figure 4:
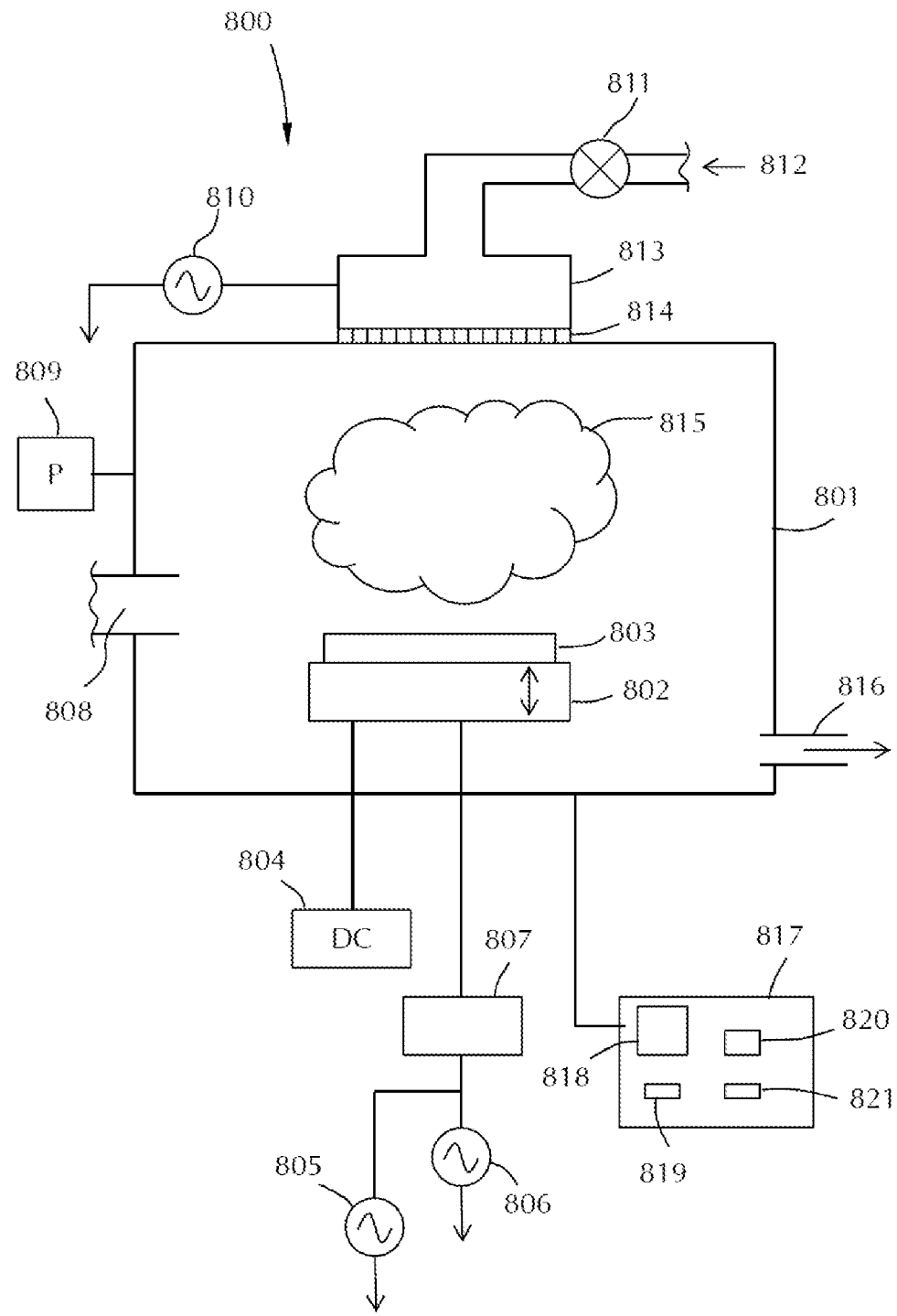
FIG. 4 is a block diagram of a process chamber in accordance with one or more embodiment of the disclosure.

FIG. 4 shows a block diagram of a plasma system 800 to perform at least some of the method of one or more embodiments. The plasma system 800 illustrated has a processing chamber 801. A movable pedestal 802 to hold a substrate 803 that has been positioned in processing chamber 801. Pedestal 802 can comprise an electrostatic chuck ("ESC"), a DC electrode embedded into the ESC, and a cooling/heating base. In an embodiment, pedestal 802 acts as a moving cathode. In an embodiment, the ESC comprises an $Al_2O_3$ material, $Y_2O_3$, or other ceramic materials known to one of ordinary skill of electronic device manufacturing. A DC power supply 804 can be connected to the DC electrode of the pedestal 802. In some embodiments, the pedestal 802 includes a heater (not shown) that is capable of raising the temperature of the substrate to the first temperature. While an electrostatic chuck is illustrated as the pedestal 802, those skilled in the art will understand that this is merely exemplary and other pedestal types are within the scope of the disclosure.

As shown in FIG. 4, a substrate 803 can be loaded through an opening 808 and placed on the pedestal 802. Plasma system 800 comprises an inlet to input one or more process gases 812 through a mass flow controller 811 to a plasma source 813. A plasma source 813 comprising a showerhead 814 is coupled to the processing chamber 801 to receive one or more process gases 812 to generate plasma. Plasma source 813 is coupled to a RF source power 810. Plasma source 813 through showerhead 814 generates a plasma 815 in processing chamber 801 from one or more process gases 812 using a high frequency electric field. Plasma 815 comprises plasma particles, such as ions, electrons, radicals, or any combination thereof. In an embodiment, power source 810 supplies power from about 50 W to about 3000 W at a frequency from about 400 kHz to about 162 MHz to generate plasma 815.

A plasma bias power 805 is coupled to the pedestal 802 (e.g., cathode) via a RF match 807 to energize the plasma. In an embodiment, the plasma bias power 805 provides a bias power that is not greater than 1000 W at a frequency between about 2 MHz to 60 MHz, and in a particular embodiment at about 13 MHz. A plasma bias power 806 may also be provided, for example, to provide another bias power that is not greater than 1000 W at a frequency from about 400 kHz to about 60 MHz, and in a particular embodiment, at about 60 MHz. Plasma bias power 806 and plasma bias power 805 are connected to RF match 807 to provide a dual frequency bias power. In an embodiment, a total bias power applied to the pedestal 802 is from about 10 W to about 3000 W.

As shown in FIG. 4, a pressure control system 809 provides a pressure to processing chamber 801. The chamber 801 has one or more exhaust outlets 816 to evacuate volatile products produced during processing in the chamber. In an embodiment, the plasma system 800 is an inductively coupled plasma (ICP) system. In an embodiment, the plasma system 800 is a capacitively coupled plasma (CCP) system.

In some embodiments, a control system 817 is coupled to the processing chamber 801. The control system 817 comprises a processor 818, a temperature controller 819 coupled to the processor 818, a memory 820 coupled to the processor 818, and input/output devices 821 coupled to the processor 818. The memory 820 can include one or more of transitory memory (e.g., random access memory) and non-transitory memory (e.g., storage).

In one embodiment, the processor 818 has a configuration to control one or more of: exposing a substrate in the processing chamber to a hafnium precursor; purging of a substrate in the processing chamber, exposing a substrate in the processing chamber to a dopant precursor, or forming a thin film comprising less than or equal to about 50 monolayers of $HfO_2$ doped with a dopant on a substrate.

The control system 817 can be configured to perform at least some of the methods as described herein and may be either software or hardware or a combination of both. The plasma system 800 may be any type of high performance processing plasma systems known in the art, such as but not limited to an etcher, a cleaner, a furnace, or any other plasma system to manufacture electronic devices.

Figure 5:
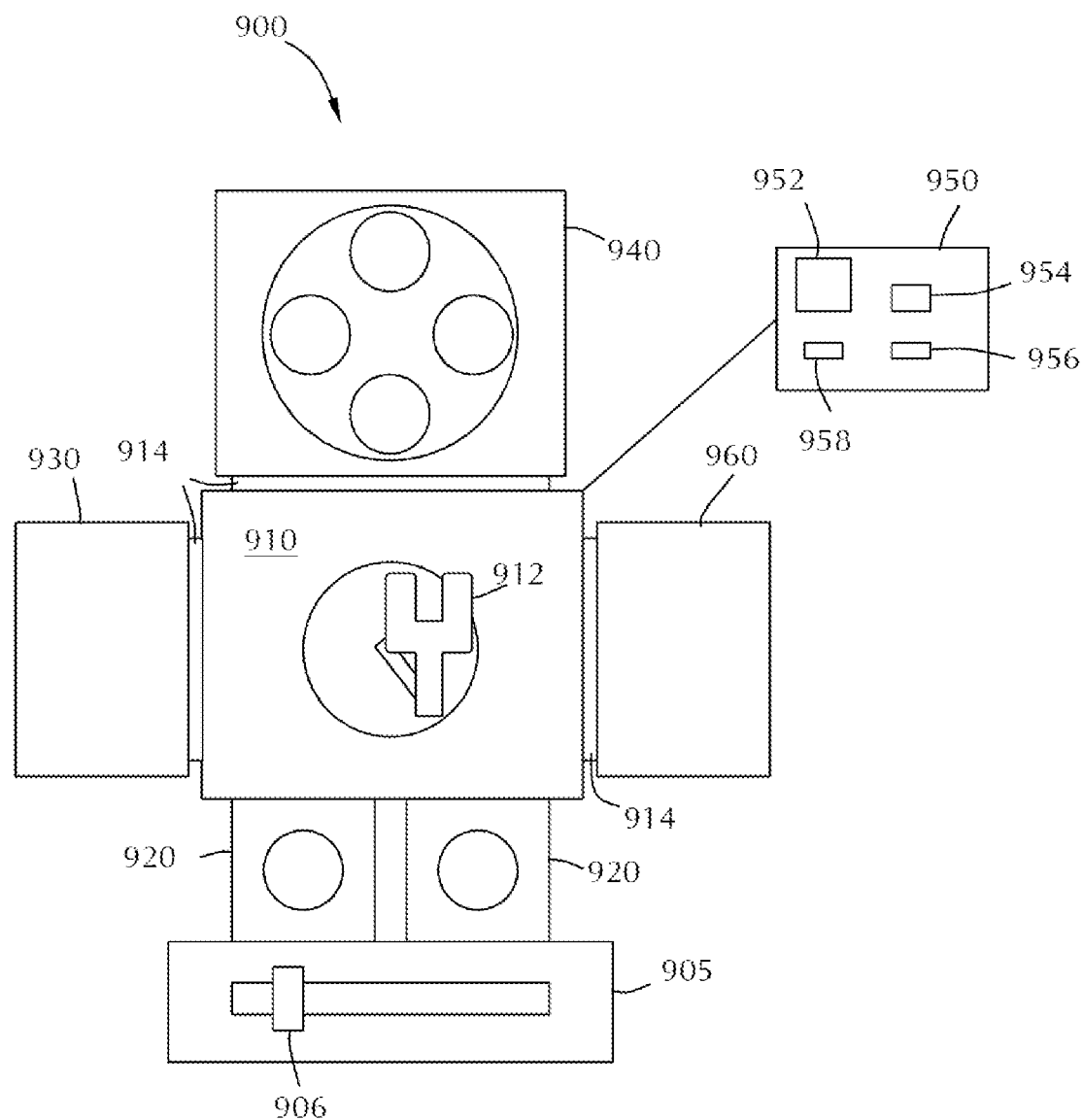
FIG. 5 is a block diagram of a cluster tool system in accordance with one or more embodiment of the disclosure.

FIG. 5 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean chamber 920 is connected to the central transfer station 910. The pre-clean chamber 920 can include one or more of a heater, a radical source or plasma source. The pre-clean chamber 920 is in fluid communication with an activating agent. An exemplary pre-clean chamber 920 is illustrated in FIG. 4 as a plasma system 800.

In some embodiments, there are two pre-clean chambers 920 connected to the central transfer station 910. In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean chamber 920. The robot 912 can them move the substrate from the pre-clean chamber 920 to other chambers within the system 900.

A deposition chamber 930 can be connected to the central transfer station 910. The deposition chamber 930 comprising a pedestal to hold a substrate. The deposition chamber 930 is in fluid communication with one or more reactive gas sources to provide one or more flows of reactive gases to the deposition chamber 930. The reactive gases of the deposition chamber include the molecule that can form the monolayer on the substrate.

The deposition chamber 930 can be any suitable chamber that can provide a flow of molecules and control the temperature of the substrate. The plasma system 800 shown in FIG. 4 can also be used as the deposition chamber 930. The substrate can be moved to and from the deposition chamber 930 by the robot 912 passing through isolation valve 914.

A selective deposition chamber 940 can also be connected to the central transfer station 910. The selective deposition chamber 940 can be any suitable deposition chamber including, but not limited to, CVD, ALD, PECVD, PEALD, or PVD chambers. In some embodiments, the selective deposition chamber 940 comprises an ALD chamber. The ALD chamber can be a time-domain chamber where the reactive gases are sequentially exposed to the substrate so that only one reactive gas is present in the chamber at any given time. In some embodiments, the ALD chamber is a spatial ALD chamber with the reactive gases are flowed into separate regions of the processing chamber at the same time and the reactive gases are separated by a gas curtain to prevent gas phase reactions between the reactive gases. In a spatial ALD chamber, the substrate is moved between regions of the processing chamber containing the various reactive gases to deposit a film.

Other process chambers can be connected to the central transfer station 910. In the embodiment shown, an ashing chamber 960 is connected to the central transfer station 910 through isolation valve 914. The ashing chamber 960 can be any suitable chamber that can remove the thin film after selective deposition.

At least one controller 950 is coupled to the central transfer station 910, the pre-clean chamber 920, the deposition chamber 930, the selective deposition chamber 940, or the ashing chamber 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

An in situ titanium nitride substrate was positioned in the processing chamber. The titanium nitride substrate was exposed to an organic platinum precursor in a carrier gas, Ar (g) at a temperature of about 130° C. The processing chamber was purged of the organic platinum precursor. The titanium nitride substrate was exposed to a reducing agent, $H_2$ (g). The processing chamber did not contain an oxidant. The processing chamber was purged of the reducing agent, $H_2$ (g). A platinum film was deposited on the in situ titanium nitride (TiN) substrate. The platinum film provided greater than 95% step coverage for 30 Å on the in situ titanium nitride. The platinum film has resistivity of about 60 μΩ-cm, and an impurity of less than 5 atomic %.

Example 2—Comparative

An aged/ex situ titanium nitride substrate was positioned in the processing chamber. The titanium nitride substrate was exposed to an organic platinum precursor in a carrier gas, Ar (g) at a temperature of about 130° C. The processing chamber was purged of the organic platinum precursor. The aged/ex situ titanium nitride substrate contained a layer of native oxide (i.e. the titanium had oxidized to titanium oxide). The aged/ex situ titanium nitride substrate was exposed to a reducing agent, $H_2$ (g). The processing chamber was purged of the reducing agent, $H_2$ (g). A platinum film was deposited on the aged/ex situ titanium nitride (TiN) substrate. The aged/ex situ titanium nitride gave poor film deposition.

Example 3

An in situ titanium nitride substrate was positioned in the deposition chamber. An organic platinum precursor was flowed into the deposition chamber in the presence of a carrier gas, Ar (g), and a reducing agent, $H_2$ (g). The deposition chamber did not contain an oxidant and was maintained at a temperature of about 130° C. A platinum film was deposited on the in situ titanium nitride. The platinum film provided greater than 95% step coverage for 30 Å on the in situ titanium nitride. The platinum film has resistivity of about 60 μΩ-cm and an impurity of less than 5 atomic %.

Example 4—Comparative

An aged/ex situ titanium nitride substrate was positioned in the deposition chamber. An organic platinum precursor was flowed into the deposition chamber in the presence of a carrier gas, Ar (g), and a reducing agent, $H_2$ (g). The deposition chamber was maintained at a temperature of about 130° C. A platinum film was deposited on the aged/ex situ titanium nitride (TiN) substrate. The aged/ex situ titanium nitride gave poor film deposition.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
flowing an organic platinum group metal precursor into a deposition chamber in the presence of a reducing agent, wherein the deposition chamber is substantially free of an oxidant, the organic platinum group metal precursor has a structure of general formula I

wherein $R^1$ and $R^2$ are independently selected from $C_{1-4}$ alkyl, hydrogen, halogen, CO, and cyclopentadienyl; M is a platinum group metal; and L is a ligand comprising at least one carbon-carbon double bond, a $(CH_2)_x$ where x is 1 to 8, and a $NR^3R^4$ where $R^3$ and $R^4$ are independently selected from $C_{1-4}$ alkyl, hydrogen, or halogen; and selectively depositing a platinum group metal film on a conductive substrate versus deposition on a nonconductive substrate in a ratio greater than or equal to 5:1 at a temperature less than 200° C., the platinum group metal film having a resistivity of less than 100 μΩ-cm and an impurity of less than 5 atomic %.

2. The method of claim 1, wherein the platinum group metal is selected from the group consisting of platinum (Pt), palladium (Pd), iridium (Ir), osmium (Os), ruthenium (Ru), rhodium (Rh), and mixtures thereof.

3. The method of claim 2, wherein the platinum group metal consists essentially of platinum (Pt).

4. The method of claim 1, wherein the reducing agent is selected from one or more of hydrogen ($H_2$), ammonia ($NH_3$), hydrazine ($N_2H_4$), silane ($SiH_4$), or disilane ($Si_2H_6$).

5. The method of claim 1, wherein the platinum group metal film is one or more of a platinum group metal metallic film, a platinum group metal carbide film, a platinum group metal nitride film, or a platinum group metal silicide film.

6. The method of claim 1, wherein the conductive substrate comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W).

7. The method of claim 6, wherein the conductive substrate is one or more of a metal, a metal carbide, a metal nitride, or a metal silicide.

8. A method of depositing a film, the method comprising:
positioning a conductive substrate in a processing chamber;

exposing the conductive substrate to an organic platinum group metal precursor to selectively deposit a platinum group metal film on the conductive substrate versus deposition on a nonconductive substrate in a ratio of greater than or equal to 5:1 at a temperature less than 200° C., the organic platinum group metal precursor having a structure of general formula I

wherein $R^1$ and $R^2$ are independently selected from $C_{1-4}$ alkyl, hydrogen, halogen, CO, and cyclopentadienyl; M is a platinum group metal; and L is a ligand comprising at least one carbon-carbon double bond, a $(CH_2)_x$ where x is 1 to 8, and a $NR^3R^4$ where $R^3$ and $R^4$ are independently selected from $C_{1-4}$ alkyl, hydrogen, or halogen;

purging the processing chamber of the organic platinum group metal precursor;

exposing the conductive substrate to a reducing agent, the processing chamber substantially free of an oxidant; and purging the processing chamber of the reducing agent, wherein the platinum group metal film has a resistivity of less than 100 μΩ-cm and an impurity of less than 5 atomic %.

9. The method of claim 8, wherein the platinum group metal is selected from the group consisting of platinum (Pt), palladium (Pd), iridium (Ir), osmium (Os), ruthenium (Ru), and rhodium (Rh).

10. The method of claim 8, wherein the reducing agent is selected from one or more of hydrogen ($H_2$), ammonia ($NH_3$), hydrazine ($N_2H_4$), silane ($SiH_4$), or disilane ($Si_2H_6$).

11. The method of claim 8, wherein the platinum group metal film is one or more of a platinum group metal metallic film, a platinum group metal carbide film, a platinum group metal nitride film, or a platinum group metal silicide film.

12. The method of claim 8, wherein the conductive substrate comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W).

13. The method of claim 8, wherein purging the processing chamber comprises flowing a purge gas over the conductive substrate.

14. The method of claim 8, wherein the purge gas is selected from one or more of argon (Ar), nitrogen ($N_2$), or helium (He).

* * * * *